(12) United States Patent
Oya

(10) Patent No.: US 12,289,942 B2
(45) Date of Patent: Apr. 29, 2025

(54) OPTICAL ELEMENT, INFRARED SENSOR, SOLID-STATE IMAGING ELEMENT, AND MANUFACTURING METHOD FOR OPTICAL ELEMENT

(71) Applicant: FUJIFILM Corporation, Tokyo (JP)

(72) Inventor: Takahiro Oya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 521 days.

(21) Appl. No.: 17/874,234

(22) Filed: Jul. 26, 2022

(65) Prior Publication Data

US 2022/0376195 A1  Nov. 24, 2022

Related U.S. Application Data

(63) Continuation of application No. PCT/JP2021/004854, filed on Feb. 10, 2021.

(30) Foreign Application Priority Data

Mar. 12, 2020 (JP) ................. 2020-042742

(51) Int. Cl.
| | |
|---|---|
| H10K 30/87 | (2023.01) |
| C09K 11/66 | (2006.01) |
| H10K 30/35 | (2023.01) |
| H10K 39/32 | (2023.01) |
| H10K 71/12 | (2023.01) |
| H10K 85/10 | (2023.01) |

(52) U.S. Cl.
CPC ............ *H10K 30/87* (2023.02); *C09K 11/661* (2013.01); *H10K 30/35* (2023.02); *H10K 39/32* (2023.02); *H10K 71/12* (2023.02); *H10K 85/141* (2023.02)

(58) Field of Classification Search
CPC ........ H10K 30/87; H10K 30/35; H10K 39/32; C09K 11/661
See application file for complete search history.

(56) References Cited

U.S. PATENT DOCUMENTS

| | | | |
|---|---|---|---|
| 8,610,170 B2 | 12/2013 | Nishida et al. | |
| 10,622,514 B1* | 4/2020 | Atanackovic | ...... H10H 20/0137 |
| 2017/0121598 A1 | 5/2017 | Min et al. | |
| 2019/0198547 A1 | 6/2019 | Yoshigiwa | |
| 2020/0190401 A1 | 6/2020 | Min et al. | |
| 2021/0072589 A1 | 3/2021 | Taguchi et al. | |
| 2021/0115219 A1 | 4/2021 | Inoue et al. | |
| 2021/0395605 A1 | 12/2021 | Min et al. | |

FOREIGN PATENT DOCUMENTS

| | | |
|---|---|---|
| CN | 107022354 | 8/2017 |
| CN | 109690779 | 4/2019 |
| JP | 2005179121 | 7/2005 |
| JP | 2008222903 | 9/2008 |
| JP | 2018037611 | 3/2018 |
| TW | 201815968 | 5/2018 |
| TW | 201920000 | 6/2019 |
| TW | 202007719 | 2/2020 |
| WO | 2011089949 | 7/2011 |
| WO | 2018061583 | 4/2018 |
| WO | 2019151042 | 8/2019 |

OTHER PUBLICATIONS

"Office Action of Taiwan Counterpart Application", with English translation thereof, issued on Nov. 27, 2024, pp. 1-14.
"Office Action of Japan Counterpart Application", issued on Jul. 11, 2023, with English translation thereof, p. 1-p. 6.
"International Search Report (Form PCT/ISA/210) of PCT/JP2021/004854," mailed on May 11, 2021, with English translation thereof, pp. 1-5.
"Written Opinion of the International Searching Authority (Form PCT/ISA/237)" of PCT/JP2021/004854, mailed on May 11, 2021, with English translation thereof, pp. 1-8.

* cited by examiner

*Primary Examiner* — Quoc D Hoang
(74) *Attorney, Agent, or Firm* — JCIPRNET

(57) ABSTRACT

An optical element includes a photoelectric conversion film and an inorganic substance-containing film containing at least one selected from the group consisting of a metal nitride and a metal oxynitride, in which the photoelectric conversion film contains a quantum dot or at least one compound semiconductor selected from the group consisting of a III-V group compound semiconductor, a II-VI group compound semiconductor, and a IV-IV group compound semiconductor, and the optical density of an inorganic substance-containing film is 0.5 or more per 1.0 μm of a film thickness at a wavelength of 1,550 nm.

14 Claims, No Drawings

OPTICAL ELEMENT, INFRARED SENSOR, SOLID-STATE IMAGING ELEMENT, AND MANUFACTURING METHOD FOR OPTICAL ELEMENT

CROSS-REFERENCE TO RELATED APPLICATIONS

This application is a Continuation of PCT International Application No. PCT/JP2021/004854 filed on Feb. 10, 2021, which claims priority under 35 U.S.C § 119(a) to Japanese Patent Application No. 2020-042742 filed on Mar. 12, 2020, Each of the above application(s) is hereby expressly incorporated by reference, in its entirety, into the present application.

BACKGROUND OF THE INVENTION

1. Field of the Invention

The present invention relates to an optical element, an infrared sensor, a solid-state imaging element, and a manufacturing method for an optical element.

2. Description of the Related Art

A photoelectric conversion film containing a quantum dot or a compound semiconductor has attracted attention as a photoelectric conversion film having sensitivity in an infrared light region. Such a photoelectric conversion film can be applied to various use applications such as an infrared sensor.

For example, WO2011/089949A discloses an optical element consisting of a compound semiconductor, and it discloses InGaAs and the like as the compound semiconductor.

SUMMARY OF THE INVENTION

As a result of investigating the characteristics of a photoelectric conversion film containing such a compound semiconductor as described in WO2011/089949A, the inventors of the present invention found that in a case where the photoelectric conversion film is exposed to a high humidity and high temperature environment for a long time, cracking occurs in the photoelectric conversion film, and thus further improvement is necessary.

In consideration of the above circumstances, an object of the present invention is to provide an optical element having a photoelectric conversion film, which is less likely to cause cracks in the photoelectric conversion film in a high humidity and high temperature environment.

Another object of the present invention is to provide an infrared sensor, a solid-state imaging element, and a manufacturing method for an optical element.

As a result of carrying out extensive investigations, the inventors of the present invention have found that the above objects can be achieved by the following configuration and have completed the present invention.

(1) An optical element comprising:
a photoelectric conversion film; and
an inorganic substance-containing film containing at least one selected from the group consisting of a metal nitride and a metal oxynitride,
in which the photoelectric conversion film contains a quantum dot or at least one compound semiconductor selected from the group consisting of a III-V group compound semiconductor, a II-VI group compound semiconductor, and a IV-IV group compound semiconductor, and
an optical density of the inorganic substance-containing film is 0.5 or more per 1.0 µm of a film thickness at a wavelength of 1,550 nm.

(2) The optical element according to (1), in which the metal nitride and the metal oxynitride contain Ti or Zr.

(3) The optical element according to (1) or (2), in which the inorganic substance-containing film further contains at least one selected from the group consisting of a phenol compound, a phosphorous acid ester compound, a thioether compound, and a hindered amine compound.

(4) The optical element according to any one of (1) to (3), in which the optical density is 1.0 or more.

(5) The optical element according to any one of (1) to (4), in which the inorganic substance-containing film further contains a resin.

(6) The optical element according to (5), in which the resin is an alkali-soluble resin.

(7) The optical element according to any one of (1) to (6), in which a ratio of the film thickness of the inorganic substance-containing film to a film thickness of the photoelectric conversion film is 0.3 to 300.

(8) An infrared sensor comprising the optical element according to any one of (1) to (7).

(9) A solid-state imaging element comprising the optical element according to any one of (1) to (7).

(10) A manufacturing method for an optical element according to any one of (1) to (7), the manufacturing method comprising:
a step of manufacturing a photoelectric conversion film that contains a quantum dot or at least one compound semiconductor selected from the group consisting of a III-V group compound semiconductor, a II-VI group compound semiconductor, and a IV-IV group compound semiconductor; and
a step of manufacturing an inorganic substance-containing film containing at least one selected from the group consisting of a metal nitride and a metal oxynitride.

(11) The manufacturing method for an optical element according to (10), in which the step of manufacturing the photoelectric conversion film includes a step of applying the composition for forming a photoelectric conversion film, containing a quantum dot and a solvent, by a spin coating method.

(12) The manufacturing method for an optical element according to (10) or (11), in which the step of manufacturing the inorganic substance-containing film includes a step of applying a polymerizable composition containing at least one selected from the group consisting of a metal nitride and a metal oxynitride by a spin coating method.

(13) The manufacturing method for an optical element according to (12), in which the polymerizable composition further contains a polymerizable compound and a polymerization initiator.

(14) The manufacturing method for an optical element according to any one of (10) to (13), in which the step of manufacturing the inorganic substance-containing film includes an exposure step and a development step.

According to the present invention, it is possible to provide an optical element having a photoelectric conversion film, which is less likely to cause cracks in the photoelectric conversion film in a high humidity and high temperature environment.

According to the present invention, it is possible to provide an optical element, an infrared sensor, a solid-state imaging element, and a manufacturing method for an optical element.

DESCRIPTION OF THE PREFERRED EMBODIMENTS

Hereinafter, the present invention will be described in detail.

The description of the following configuration requirements is made based on representative embodiments of the present invention in some cases; however, the present invention is not limited to the embodiments.

It is noted that in the present specification, a numerical value range expressed using "to" means a range including numerical values described before and after "to" as a lower limit value and an upper limit value.

In the present specification, regarding the description of a group (an atomic group), in a case where whether the group is substituted or unsubstituted is not described, the group includes a group which has a substituent as well as a group which does not have a substituent. For example, an "alkyl group" includes not only an alkyl group (an unsubstituted alkyl group) which does not have a substituent but also an alkyl group (a substituted alkyl group) which has a substituent.

In addition, "actinic rays" or "radiation" in the present specification means, for example, a bright line spectrum of a mercury lamp, such as a g-line, an h-line, or an i-line, far ultraviolet rays typified by an excimer laser, extreme ultraviolet rays (EUV rays), X-rays, electron beams (EB), or the like. In addition, in the present invention, light means actinic rays or radiation.

Further, unless otherwise specified, "exposure" in the present specification includes not only exposure by a bright line spectrum of a mercury lamp, far ultraviolet rays typified by an excimer laser, extreme ultraviolet rays, X-rays, EUV light, or the like, but also the exposure includes drawing by particle beams such as electron beams and ion beams.

In the present specification, "(meth)acrylate" represents acrylate and methacrylate. In the present specification, "(meth)acryl" represents acryl and methacryl. In the present specification, "(meth)acryloyl" represents acryloyl and methacryloyl.

In the present specification, "ppm" means "parts per million ($10^{-6}$)", "ppb" means "parts per billion ($10^{-9}$)", and "ppt" means "parts per trillion ($10^{-12}$)".

In addition, in the present specification, a weight-average molecular weight (Mw) is a value in terms of polystyrene, as measured by a gel permeation chromatography (GPC) method.

In the present specification, the GPC method is based on a method in which HLC-8020 GPC (manufactured by TOSOH CORPORATION) is used, TSKgel SuperHZM-H, TSKgel SuperHZ4000, and TSKgel SuperHZ2000 (manufactured by TOSOH CORPORATION, 4.6 mm ID×15 cm) are used as columns, and tetrahydrofuran (THF) is used as an eluent.

A bonding direction of a divalent group (for example, —COO—) described in the present specification is not limited unless otherwise specified. For example, in a case where Y is —COO— in a compound represented by the general formula of "X—Y—Z", the compound may be "X—O—CO—Z" or "X—CO—O—Z".

One of the feature points of the optical element according to the embodiment of the present invention is that an inorganic substance-containing film containing at least one selected from the group consisting of a metal nitride and a metal oxynitride (hereinafter, also simply referred to as an "inorganic substance-containing film") is used, here the optical density of the inorganic substance-containing film is 0.5 or more per 1.0 μm of a film thickness at a wavelength of 1,550 nm.

As a result of investigating the reason why cracking occurs in the photoelectric conversion film containing a quantum dot and a predetermined compound semiconductor, the inventors of the present invention found that the oxidation of the quantum dot and the predetermined compound semiconductor in the photoelectric conversion film proceeds, and thus cracking occurs. On the other hand, in a case where the above-described inorganic substance-containing film is used in combination with the photoelectric conversion film, the metal nitride and the metal oxynitride in the inorganic substance-containing film suppress the oxidation of the quantum dot and the predetermined compound semiconductor in the photoelectric conversion film. It is conceived that the reason why the oxidation of the quantum dot and the predetermined compound semiconductor in the photoelectric conversion film is suppressed as described above is that the metal nitride and the metal oxynitride in the inorganic substance-containing film preferentially react with oxygen to be oxidized, whereby the oxidation of the quantum dot and the predetermined compound semiconductor in the photoelectric conversion film is suppressed. That is, it is conceived that the metal nitride and the metal oxynitride in the inorganic substance-containing film are sacrificially oxidized, whereby the oxidation of the quantum dot and the predetermined compound semiconductor in the photoelectric conversion film is delayed.

Further, the optical density of the inorganic substance-containing film relates to the contents of the metal nitride and the metal oxynitride in the inorganic substance-containing film. That is, in a case where the contents of the metal nitride and the metal oxynitride are large, the optical density of the inorganic substance-containing film is high. As described above, in a case of considering that the metal nitride and the metal oxynitride are sacrificially oxidized, the larger the contents of the metal nitride and the metal oxynitride are, the more the oxidation of the photoelectric conversion film is suppressed. The inventors of the present invention found that a desired effect can be obtained in a case where the inorganic substance-containing film has an optical density equal to or more than a predetermined optical value (in other words, the contents of the metal nitride and the metal oxynitride are equal to or more than a predetermined value).

The optical element according to the embodiment of the present invention has a predetermined photoelectric conversion film and an inorganic substance-containing film.

The arrangement relationship between the photoelectric conversion film and the inorganic substance-containing film is not particularly limited. However, it is preferable that the photoelectric conversion film and the inorganic substance-containing film are adjacent to each other, and it is more preferable that the inorganic substance-containing film is arranged on the photoelectric conversion film. In addition, in a case where the inorganic substance-containing film is arranged on the photoelectric conversion film, the inorganic substance-containing film may be arranged on the entire surface of the photoelectric conversion film, or the inorganic substance-containing film may be arranged on a part of the surface of the photoelectric conversion film.

Hereinafter, each member of the optical element will be described in detail.

<Photoelectric Conversion Film>

The photoelectric conversion film contains a quantum dot or at least one compound semiconductor selected from the group consisting of a III-V group compound semiconductor, a II-VI group compound semiconductor, and a IV-IV group compound semiconductor. It is noted that, hereinafter, at least one compound semiconductor selected from the group consisting of a III-V group compound semiconductor, a II-VI group compound semiconductor, and a IV-IV group compound semiconductor is also referred to as a specific semiconductor compound.

The photoelectric conversion film is preferably a film capable of receiving infrared light (light in the wavelength range in the infrared region). With such a photoelectric conversion film, infrared light can be acquired as an electric signal.

The infrared light is intended to be light having a wavelength of 800 to 4,500 nm, and the infrared light that can be received by the photoelectric conversion film is preferably light having a wavelength of 800 to 2,500 nm.

Hereinafter, the materials contained in the photoelectric conversion film will be described in detail.

(Quantum Dot)

The quantum dot is a fine particle of a semiconductor, and the maximal absorption wavelength of the quantum dots is not particularly limited. However, it is preferably present in a range of 800 nm or more, more preferably in a range of 800 to 4,500 nm, still more preferably in a range of 800 to 3,500 nm, and particularly preferably in a range of 800 to 2,500 nm.

Examples of the material of the quantum dot include a III-V group compound semiconductor, a II-VI group compound semiconductor, a IV-IV group compound semiconductor, a semiconductor such as silicon, and carbon. The III-V group compound semiconductor, the II-VI group compound semiconductor, and the IV-IV group compound semiconductor will be described in detail later.

Specific examples of the material of the quantum dot include CdS, CdSe, PbS, PbSe, and InAs.

A ligand may be coordinated on the surface of the quantum dot. Examples of the ligand include a compound having a coordinating group such as an amino group, a carboxy group, a mercapto group, a phosphine group, or a phosphine oxide group. The ligand is preferably a polydentate ligand, more preferably a polydentate ligand in which at least one of the coordinating groups is selected from the group consisting of an amino group and a mercapto group, and still more preferably a bidentate or tridentate ligand in which at least one of the coordinating groups is selected from the group consisting of an amino group and a mercapto group. Specific examples of the ligand include hexylamine, decylamine, hexadecylamine, octadecylamine, oleylamine, myristylamine, laurylamine, oleic acid, mercaptopropionic acid, trioctylphosphine, and trioctylphosphine oxide.

The shape of the quantum dot is not particularly limited, and examples thereof include a spherical shape, a rod-like shape, and an elliptical spherical shape. In a case where the shape of the quantum dot is a spherical shape, the average particle diameter of the quantum dots is preferably 0.1 to 100 nm, more preferably 0.5 to 50 nm, and still more preferably 1 to 25 nm. In the present specification, the average particle diameter of the quantum dots is a value measured by a dynamic light scattering method.

(Compound Semiconductor)

The III-V group compound semiconductor is a compound semiconductor formed from a Group III element and a Group V element. Examples of the III-V group compound semiconductor include GaAs, GaP, AlAs, AlSb, InSb, InAs, GaAsP, InGaAs, InGaP, GaInAsP, AlGaP, AlGaAs, InP, InAlAs, and AlGaInP.

The II-VI group compound semiconductor is a compound semiconductor formed from a Group II element and a Group VI element. Examples of the II-VI group compound semiconductor include ZnO, CdTe, and ZnSe.

The VI-VI group compound semiconductor is a compound semiconductor in which two Group VI elements are combined. Examples of the VI-VI group compound semiconductor include SiC and SiGe.

The film thickness of the photoelectric conversion film is not particularly limited. However, it is preferably 1 to 10,000 nm and more preferably 10 to 1,000 nm from the viewpoint that the cracking of the photoelectric conversion film is less likely to occur in a high humidity and high temperature environment (hereinafter, also referred to as "the effect of the present invention is more excellent").

The contents of the quantum dot and the specific compound semiconductor in the photoelectric conversion film are not particularly limited. However, from the viewpoint of photoelectric conversion characteristics, the contents of the quantum dot and the specific compound semiconductor are preferably 30% by mass, more preferably 50% by mass or more, and still more preferably 70% by mass or more, with respect to the total mass of the photoelectric conversion film. The upper limit thereof is not particularly limited, which includes 100% by mass. The content of the specific compound semiconductor referred to here does not include the content of the quantum dot of which the material is the III-V group compound semiconductor, the II-VI group compound semiconductor, or the IV-IV group compound semiconductor. The content of the quantum dot includes the content of the quantum dot of which the material is the III-V group compound semiconductor, the II-VI group compound semiconductor, or the IV-IV group compound semiconductor.

The above content corresponds to the total content of the quantum dot and the specific compound semiconductor, and the content of the specific compound semiconductor is calculated as 0% by mass, for example, in a case where the photoelectric conversion film does not contain the specific compound semiconductor.

The method of forming the photoelectric conversion film is not particularly limited, and examples thereof include a wet-type film forming method and a dry-type film forming method.

Examples of the forming method by the dry-type film forming method include a chemical vapor deposition method and a physical vapor deposition method.

Examples of the forming method by the wet-type film forming method include a method of forming a photoelectric conversion film by using a composition for forming a photoelectric conversion film, containing quantum dots and a solvent, and applying the composition onto a support such as an electrode according to a coating method known in the related art. Examples of the coating method include a drop casting method; a slit coating method; a spray coating method; a roll coating method; a spin coating method; a cast coating method; a slit and spin method; a pre-wetting method (for example, a method described in JP2009-145395A); various printing methods including a jet printing method such as an ink jet method (for example, an on-demand method, a piezoelectric method, or a thermal method) or a nozzle jet method, a flexographic printing method, a screen printing method, a gravure printing method, a reverse offset printing method, and a metal mask printing method; a transfer method using a mold or the like; and a nanoimprinting method.

<Inorganic Substance-Containing Film>

The inorganic substance-containing film is a film containing at least one selected from the group consisting of a metal nitride and a metal oxynitride. The metal nitride and the metal oxynitride will be described in detail later.

The optical density of the inorganic substance-containing film is 0.5 or more per 1.0 μm of a film thickness at a wavelength of 1,550 nm, and it is preferably 1.0 or more and more preferably 1.2 or more from the viewpoint that the effect of the present invention is more excellent. The upper limit thereof is not particularly limited. However, it is 3.0 or less in a large number of cases, and it is 2.5 or less in a larger number of cases.

Regarding the measuring method for the optical density, a device in which a spectrophotometer U-4100 (manufactured by Hitachi High-Tech Corporation) is combined with an integrating sphere type light receiving unit is used to measure the light transmittance (%) of an inorganic substance-containing film having a predetermined thickness at a wavelength of 1,550 nm, which is converted, for determination, into an optical density per 1.0 μm of film thickness.

The film thickness of the inorganic substance-containing film is not particularly limited; however, it is preferably 0.1 to 4.0 μm and more preferably 1.0 to 2.5 μm.

The ratio of the film thickness of the inorganic substance-containing film to the film thickness of the photoelectric conversion film (the film thickness of the inorganic substance-containing film/the film thickness of the photoelectric conversion film) is preferably 0.3 to 300, more preferably 0.5 to 250, and still more preferably 0.8 to 200.

(Metal Nitride and Metal Oxynitride)

The inorganic substance-containing film contains at least one selected from the group consisting of a metal nitride and a metal oxynitride.

It is noted that the inorganic substance-containing film may contain both a metal nitride and a metal oxynitride.

The kinds of the metal nitride and the metal oxynitride are not particularly limited. However, it is preferable to contain any one of the transition metal elements of Group 3 to Group 11 from the viewpoint that the effect of the present invention is more excellent. Specifically, examples thereof include, as transition metal elements Group 3, Sc, Dy, Ho, Er, Tm, Lu, Th, Pa, U, Np, Pu, Am, Cm, Bk, Cf, Es, Fm, Md, No, and Lr; as transition metal elements of Group 4, Ti, Zr, and Hf; as transition metal elements of Group 5, V, Nb, and Ta; as transition metal elements of Group 6, Cr, Mo, and W; as transition metal elements of Group 7, Mn, Tc, and Re; as transition metal elements of Group 8, Fe, Ru, and Os; as transition metal elements of Group 9, Co, Rh, and Ir; as transition metal elements of Group 10, Ni, Pd, and Pt; and as transition metal elements of Group 11, Cu and Ag.

Among them, a transition metal element of Group 4 is preferable, and Ti or Zr is more preferable from the viewpoint that the effect of the present invention is more excellent. That is, titanium nitride or zirconium nitride is preferable as the metal nitride, and titanium oxynitride (titanium black) or zirconium oxynitride is preferable as the metal oxynitride.

It is noted that the metal nitride and the metal oxynitride may contain any one of the Group 13 to Group 17 elements in addition to the above-described transition metal elements of Group 3 to Group 11.

The shapes of the metal nitride and the metal oxynitride in the inorganic substance-containing film are not particularly limited; however, they are a particulate shape in a large number of cases. That is, the inorganic substance-containing film preferably contains metal nitride particles or metal oxynitride particles. The metal nitride and the metal oxynitride in the inorganic substance-containing film are preferably a black pigment.

The average particle diameters of the metal nitride particles and the metal oxynitride particles are not particularly limited; however, they are preferably 5 to 100 nm, more preferably 5 to 50 nm, and still more preferably 5 to 30 nm.

The specific surface areas of the metal nitride particle and the metal oxynitride particle is not particularly limited; however, it is preferably 5 to 100 $m^2/g$ or less.

The manufacturing methods for the metal nitride and the metal oxynitride are not particularly limited, and a known manufacturing method in the related art such as a gas-phase reaction method can be used. Examples of the gas-phase reaction method include an electric furnace method and a thermal plasma method, but from the viewpoint that few impurities are mixed in, particle diameters are likely to be uniform, and productivity is high, a thermal plasma method is preferable.

The surface of the metal nitride and the metal oxynitride may be coated. Regarding the coating, the entire surface of the particle may be coated or a part thereof may be coated. The coating is preferably coating with a silane coupling agent, silica, or alumina.

The total content of the metal nitride and the metal oxynitride compound in the inorganic substance-containing film is preferably 5% to 95% by mass, more preferably 20% to 80% by mass, and still more preferably 35% to 65% by mass, with respect to the total solid content of the inorganic substance-containing film.

The inorganic substance-containing film may contain other components other than the metal nitride and the metal oxynitride.

(Resin)

The inorganic substance-containing film may contain a resin. The resin can function as a so-called binder.

The molecular weight of the resin is preferably more than 3,000. In a case where the molecular weight of the resin is polydisperse, it is preferable that the weight-average molecular weight thereof is more than 3,000.

The resin also preferably contains an acid group (for example, a carboxyl group, a sulfo group, a monosulfate ester group, —$OPO(OH)_2$, a monophosphate ester group, a borate group, and/or a phenolic hydroxyl group). That is, the resin is preferably a resin containing an acid group.

The resin also preferably contains a curable group. Examples of the curable group include an ethylenic unsaturated group (for example, a (meth)acryloyl group, a vinyl group, or a styryl group), and a cyclic ether group (for example, an epoxy group or an oxetanyl group).

The resin according to the embodiment of the present invention may be any one of a dispersing agent, an alkali-soluble resin, or the like.

[Dispersing Agent]

The dispersing agent is, for example, a resin that is capable of suppressing the aggregation and/or sedimentation of components present in a solid state, such as metal nitride and metal oxynitride in the composition for forming an inorganic substance-containing film, as will be described later.

The content of the dispersing agent is preferably 3% to 60% by mass, more preferably 7% to 40% by mass, and still more preferably 10% to 25% by mass, with respect to the total mass of the inorganic substance-containing film.

The dispersing agent preferably contains an acid group.

The dispersing agent also preferably contains a curable group.

Examples of the dispersing agent include a resin containing a structural unit containing a graft chain and/or a resin containing a radial structure.

Examples of the structural unit containing a graft chain, in the resin containing the structural unit containing a graft chain include a structural unit represented by any one of Formulae (1) to (4).

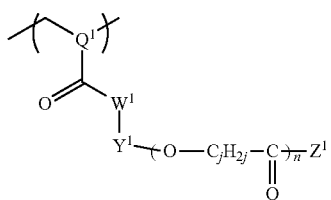

(1)

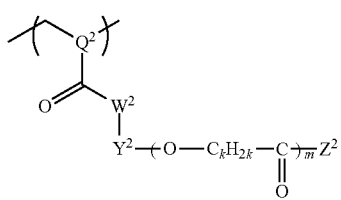

(2)

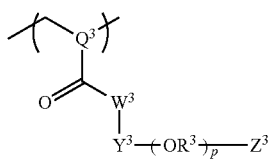

(3)

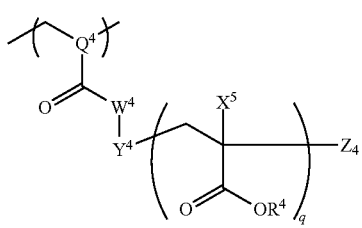

(4)

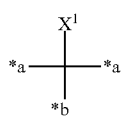

(QX1)

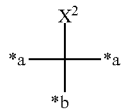

(QX2)

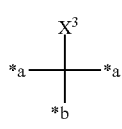

(QX3)

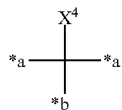

(QX4)

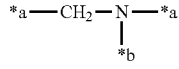

(QNA)

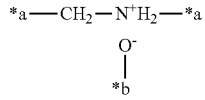

(QNB)

In Formulae (1) to (4), $Q^1$ is a group represented by any one of Formulae (QX1), (QNA), and (QNB), $Q^2$ is a group represented by any one of Formulae (QX2), (QNA), and (QNB), $Q^3$ is a group represented by any one of Formulae (QX3), (QNA), and (QNB), and $Q^4$ is a group expressed by any one of Formulae (QX4), (QNA), and (QNB).

In Formulae (QX1) to (QX4), (QNA), and (QNB), *a represents a bonding position on the main chain side, and *b represents a bonding position on the side chain side.

In Formulae (1) to (4), $W^1$, $W^2$, $W^3$, and $W^4$ each independently represent a single bond, an oxygen atom, or NH.

In Formulae (1) to (4) and Formulae (QX1) to (QX4), $X^1$, $X^2$, $X^3$, $X^4$, and $X^5$ each independently represent a hydrogen atom or a monovalent organic group. From the viewpoint of the restriction on synthesis, $X^1$, $X^2$, $X^3$, $X^4$, and $X^5$ are preferably each independently a hydrogen atom or an alkyl group having 1 to 12 carbon atoms (the number of carbon atoms), more preferably each independently a hydrogen atom or a methyl group, and still more preferably each a methyl group.

In Formulae (1) to (4), $Y^1$, $Y^2$, $Y^3$ and $Y^4$ each independently represent a single bond or a divalent linking group, and the linking group is not particularly limited regarding the structure. Specific examples of the divalent linking groups represented by $Y^1$, $Y^2$, $Y^3$, and $Y^4$ include linking groups represented by the following (Y-1) to (Y-23).

In the linking group shown below, A represents a bonding position to any one of $W^1$ to $W^4$ in Formulae (1) to (4). B represents a bonding position to a group on a side opposite to any one of $W^1$ to $W^4$, to which A is bonded.

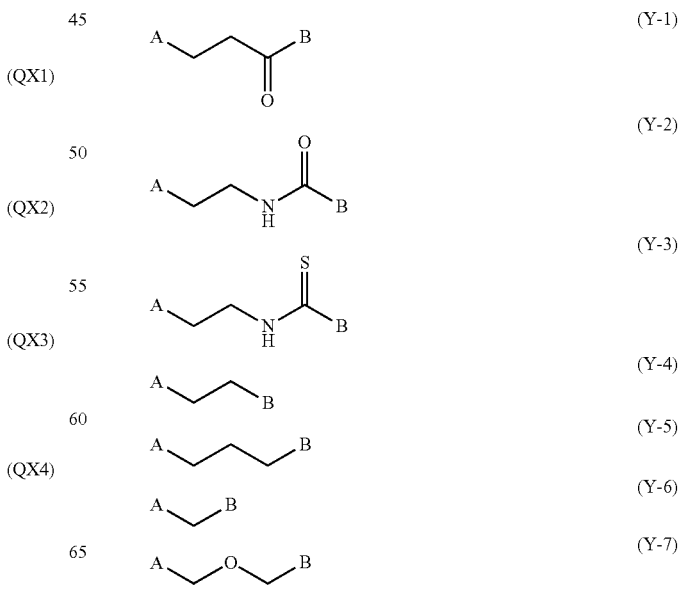

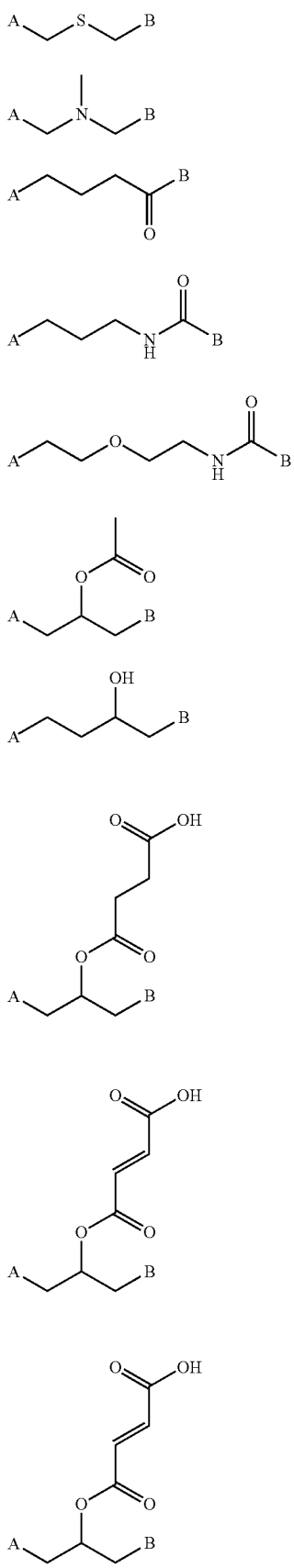
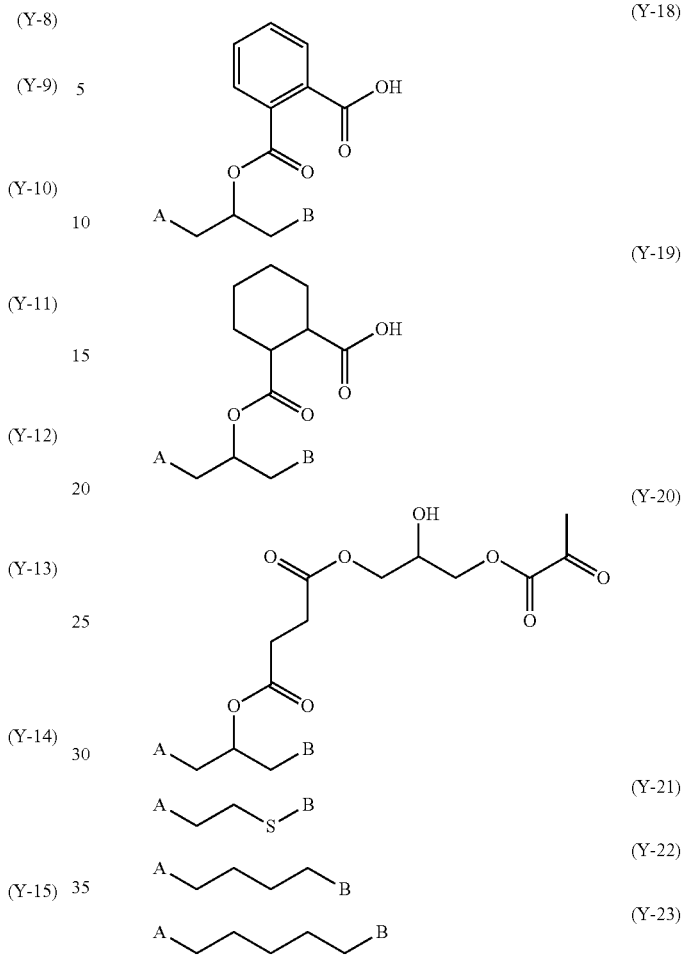

In Formulae (1) to (4), $Z^1$, $Z^2$, $Z^3$, and $Z^4$ each independently represent a monovalent substituent. The structure of the substituent is not particularly limited; however, specific examples thereof include an alkyl group, a hydroxyl group, an alkoxy group, an aryloxy group, a heteroaryloxy group, an alkylthio group, an arylthio group, a heteroarylthio group, and an amino group.

Among them, particularly from the viewpoint of improvement in the dispersibility, the substituents represented by $Z^1$, $Z^2$, $Z^3$, and $Z^4$ are preferably a group that exhibits a steric repulsion effect, and more preferably an alkyl group or alkoxy group having 5 to 24 carbon atoms, and among them, still more preferably a branched alkyl group having 5 to 24 carbon atoms, a cyclic alkyl group having 5 to 24 carbon atoms, or an alkoxy group having 5 to 24 carbon atoms. It is noted that the alkyl group contained in the alkoxy group may be either linear, branched, or cyclic.

In addition, it is also preferable that the substituents represented by $Z^1$, $Z^2$, $Z^3$, and $Z^4$ are each a group containing a curable group such as a (meth)acryloyl group. Examples of the group containing a curable group include an "—O-alkylene group-(—O-alkylene group-)$_{AL}$-(meth)acryloyloxy group". AL represents an integer of 0 to 5 and is preferably 1. The alkylene groups each independently preferably have 1 to 10 carbon atoms. In a case where the alkylene group has a substituent, the substituent is preferably a hydroxyl group.

The substituent may be a group containing an onium structure.

The group containing an onium structure is a group having an anionic moiety and a cationic moiety. Examples of the anionic moiety include a partial structure containing an oxygen anion (—O$^-$). Among them, the oxygen anion (—O$^-$) is preferably directly bonded to a terminal of a repeating structure attached with n, m, p, or q in the repeating units represented by Formulae (1) to (4), and more preferably directly bonded to a terminal (that is, a right end in —(—O—C$_j$H$_{2j}$—CO—)$_n$—) of a repeating structure attached with n in the repeating unit represented by Formula (1).

Examples of the cation of the cationic moiety of the group containing an onium structure include an ammonium cation. In a case where the cationic moiety is the ammonium cation, the cationic moiety is a partial structure containing the cationic nitrogen atom (>N$^+$<). The cationic nitrogen atom (>N$^+$<) is preferably bonded to four substituents (preferably, organic groups), and it is preferable that one to four among the substituents are each an alkyl group having 1 to 15 carbon atoms. In addition, it is also preferable that one or more (preferably, one) among the four substituents are each a group containing a curable group. Examples of the group containing a curable group, which can serve as a substituent, include the above-described "—O-alkylene group-(—O-alkylene group-)$_{AL}$-(meth)acryloyloxy group".

In Formulae (1) to (4), n, m, p, and q are each independently an integer of 1 to 500, more preferably an integer of 2 to 500, and still more preferably an integer of 6 to 500.

In Formula (3), R$^3$ represents a branched or linear alkylene group, is preferably an alkylene group having 1 to 10 carbon atoms, and is more preferably an alkylene group having 2 or 3 carbon atoms.

In Formula (4), R$^4$ represents a hydrogen atom or a monovalent organic group. It is noted that the structure of the monovalent organic group is not particularly limited. R$^4$ is preferably a hydrogen atom, an alkyl group, an aryl group, or a heteroaryl group, and more preferably a hydrogen atom or an alkyl group. In a case where R$^4$ is an alkyl group, the alkyl group is preferably a linear alkyl group having 1 to 20 carbon atoms, a branched alkyl group having 3 to 20 carbon atoms, or a cyclic alkyl group having 5 to 20 carbon atoms.

In the resin containing a structural unit containing a graft chain, the total content of the structural unit represented by any one of Formulae (1) to (4) is preferably 2% to 100 and more preferably 6% to 100% by mass with respect to the total mass of the resin.

The resin containing a radial structure is preferably, for example, a compound represented by General Formula (X-2).

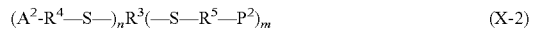

$$(A^2-R^4—S—)_n R^3(—S—R^5—P^2)_m \quad (X-2)$$

In General Formula (X-2), A$^2$ represents a monovalent organic group containing at least one moiety selected from an organic dye structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group. The n pieces of A$^2$ may be the same or different from each other.

In General Formula (X-2), R$^4$ and R$^5$ each independently represent a single bond or a divalent organic linking group.

Examples of the divalent organic linking group include a group containing 1 to 100 carbon atoms, 0 to 10 nitrogen atoms, 0 to 50 oxygen atoms, 1 to 200 hydrogen atoms, and 0 to 20 sulfur atoms. The divalent organic linking group is preferably an alkylene group which may contain a substituent. The alkylene group preferably has 2 to 5 carbon atoms. The substituent that is capable of being contained in the alkylene group is preferably an acid group.

n pieces of R$^4$ may be the same or different from each other. In addition, m pieces of R$^5$ may be the same or different from each other.

In General Formula (X-2), R$^3$ represents an (m+n)-valent organic linking group. m+n is preferably 3 to 10.

Examples of the (m+n)-valent organic linking group represented by R$^3$ include a group containing 1 to 60 carbon atoms, 0 to 10 nitrogen atoms, 0 to 50 oxygen atoms, 1 to 100 hydrogen atoms, and 0 to 20 sulfur atoms.

In General Formula (X-2), m represents an integer of 1 to 8.

Further, in General Formula (X-2), n represents an integer of 2 to 9.

Further, P$^2$ in General Formula (X-2) represents a polymer skeleton, and it can be selected from known polymers and the like according to the purpose. m pieces of P$^2$ may be the same or different from each other.

The polymer skeleton is preferably a polymer skeleton consisting of at least one selected from the group consisting of a polymer or copolymer of a vinyl monomer, an ester-based polymer, an ether-based polymer, a urethane-based polymer, an amide-based polymer, an epoxy-based polymer, a silicone-based polymer, or a modified product or copolymer thereof, [for example, a polyether/polyurethane copolymer or a copolymer of a polymer of polyether/a vinyl monomer (any one of a random copolymer, a block copolymer, or a graft copolymer may be good) is included].

Among the above, the polymer skeleton is preferably a polymer skeleton consisting of a polymer or copolymer of a vinyl monomer, and it is more preferably a polymer skeleton consisting of a polymer or a copolymer of (meth)acrylic acid and/or (meth)acrylic acid esters.

As the dispersing agent, it is also possible to use, for example, the polymer compounds described in paragraphs 0071 to 0141 of WO2019/069690A.

[Alkali-Soluble Resin]

The alkali-soluble resin is, for example, a resin that is capable of exhibiting solubility in a basic solution such as a basic aqueous solution.

The alkali-soluble resin is preferably a resin different from the above-described dispersing agent.

The content of the alkali-soluble resin is preferably 0.1% to 30% by mass, more preferably 0.5% to 25% by mass, and still more preferably 1% to 15% by mass, with respect to the total mass of the inorganic substance-containing film.

The alkali-soluble resin preferably contains an acid group as an alkali-soluble group for achieving alkali solubility.

The alkali-soluble resin also preferably contains a curable group. The alkali-soluble resin also preferably contains a structural unit containing a curable group. The content of the structural unit containing a curable group is preferably 5% to 60% by mole, more preferably 10% to 45% by mole, and still more preferably 15% to 35% by mole, with respect to all the structural units of the alkali-soluble resin.

As the alkali-soluble resin, a copolymer of [benzyl (meth)acrylate/(meth)acrylic acid/another addition polymerizable vinyl monomer, as needed], and a copolymer of [allyl (meth)acrylate/(meth)acrylic acid/another addition polymerizable vinyl monomer, as needed] are suitable because the copolymers have an excellent balance among film hardness, sensitivity, and developability.

The other addition polymerizable vinyl monomer may be one kind or two or more kinds.

The copolymer preferably has a curable group and more preferably contains an ethylenically unsaturated bond such as a (meth)acryloyl group.

For example, a curable group may be introduced into a copolymer by using a monomer having the curable group as the other addition polymerizable vinyl monomer. In addition, a curable group (preferably, an ethylenically unsaturated bond such as (meth)acryloyl group) may be introduced into a part or all of one or more units derived from (meth)acrylic acid and/or units derived from the other addition polymerizable vinyl monomer in the copolymer.

As the alkali-soluble resin, it is possible to use, for example, the resins described in paragraphs 0143 to 0163 of WO2019/069690A.

The weight-average molecular weights of the dispersing agent and the resin such as the alkali-soluble resin are each independently preferably more than 3,000 and 100,000 or less, and more preferably more than 3,000 and 50,000 or less.

The acid values of the dispersing agent and the resin such as the alkali-soluble resin are each independently preferably 10 to 300 mgKOH/g and more preferably 30 to 200 mgKOH/g.

The amine values of the dispersing agent and the resin such as the alkali-soluble resin are each independently preferably 0 to 100 mgKOH/g and more preferably 0 to 25 mgKOH/g.

The inorganic substance-containing film may contain a polymer of a polymerizable compound described later, in addition to the above-described dispersing agent and alkali-soluble resin. As will be described later, in a case where the inorganic substance-containing film is formed by using the composition for forming an inorganic substance-containing film containing a polymerizable compound, a polymer of the polymerizable compound is contained in the formed inorganic substance-containing film.

The polymerizable compound will be described later.

The content of the resin in the inorganic substance-containing film is preferably 5% to 70% by mass, more preferably 10% to 60% by mass, and still more preferably 20% to 50% by mass, with respect to the total mass of the inorganic substance-containing film.

In a case where two or more resins are used in combination, the total content thereof is preferably within the above range.

(Other Additives)

From the viewpoint that the effect of the present invention is more excellent, the inorganic substance-containing film preferably contains at least one selected from a phenol compound, a phosphorous acid ester compound, a thioether compound, or a hindered amine compound, and it more preferably contains at least one selected from a phenol compound and a hindered amine compounds. The group of the above compounds acts as an antioxidant.

Specific examples of the above compound include p-methoxyphenol, 2,5-di-tert-butyl-4-methylphenol, 2,6-di-tert-butyl-4-methylphenol, 4,4'-thiobis(3-methyl-6-t-butylphenol), 2,2'-methylenebis(4-methyl-6-t-butylphenol), 4-methoxynaphthol, hydroquinone, 2,6-di-tert-butylhydroquinone, benzoquinone, 2,2,6,6-tetramethylpiperidine-1-oxyl free radical, and 4-hydroxy-2,2,6,6-tetramethylpiperidine-1-oxyl free radical.

The content of the antioxidant in the inorganic substance-containing film is preferably 0.001% to 10% by mass, more preferably 0.0025% to 5% by mass, and still more preferably 0.005% to 1% by mass, with respect to the total mass of the inorganic substance-containing film.

(Manufacturing Method for Inorganic Substance-Containing Film)

The manufacturing method for an inorganic substance-containing film is not particularly limited; however, it is preferably a method of forming an inorganic substance-containing film by using a composition for forming an inorganic substance-containing film, which contains at least one selected from the group consisting of a metal nitride and a metal oxynitride. The above-described resin may be contained in the composition for forming an inorganic substance-containing film. Further, the composition for forming an inorganic substance-containing film may contain components contained in the polymerizable composition described later.

The manufacturing method for an inorganic substance-containing film is preferably a method of obtaining an inorganic substance-containing film by curing a composition layer formed from at least one selected from the group consisting of a metal nitride and a metal oxynitride, and a composition for forming an inorganic substance-containing film (hereinafter, also simply referred to as a "polymerizable composition"), which contains a polymerizable compound. More specifically, the manufacturing method for an inorganic substance-containing film is not particularly limited; however, it preferably includes the following steps.

Composition layer forming step
Exposure step
Development step

Hereinafter, each step will be described.

[Composition Layer Forming Step]

The composition layer forming step is a step of applying a polymerizable composition that contains at least one selected from the group consisting of a metal nitride and a metal oxynitride and contains a polymerizable compound, by a spin coating method.

Hereinafter, first, the polymerizable composition will be described in detail, and then the procedure of the step will be described in detail.

—Metal Nitride and Metal Oxynitride—

The polymerizable composition contains at least one selected from the group consisting of a metal nitride and a metal oxynitride. The metal nitride and the metal oxynitride are as described above.

The total content of the metal nitride compound and the metal oxynitride compound in the polymerizable composition is not particularly limited; however, it is preferably 5% to 95% by mass, more preferably 20% to 80% by mass, and still more preferably 35% to 65% by mass, with respect to the total solid content of the polymerizable composition.

In the present specification, the "solid content" of the polymerizable composition refers to components that form an inorganic substance-containing film, and it refers to all components except a solvent in a case where the polymerizable composition contains the solvent (an organic solvent, water, or the like). Moreover, in a case where the components are components that form an inorganic substance-containing film, the components are regarded as the solid contents even in a case where the components are liquid components.

—Polymerizable Compound—

It is preferable that the polymerizable composition invention contains a polymerizable compound.

In the present specification, the polymerizable compound is a compound that is polymerized by the action of the photopolymerization initiator which will be described later, and it is a component different from the dispersing agent and the resin such as the alkali-soluble resin.

The polymerizable compound is preferably a low-molecular-weight compound. The low-molecular-weight compound referred to here is preferably a compound having a molecular weight of 3,000 or less.

The polymerizable compound is preferably a compound containing an ethylenically unsaturated bond.

That is, the polymerizable composition preferably contains, as a polymerizable compound, a low-molecular-weight compound containing an ethylenically unsaturated group.

The polymerizable compound is preferably a compound containing one or more ethylenically unsaturated bonds such as a (meth)acryloyl group), more preferably a compound containing two or more ethylenically unsaturated bonds, still more preferably a compound containing three or more ethylenically unsaturated bonds, and particularly preferably a compound containing five or more ethylenically unsaturated bonds. The upper limit is, for example, 15 ethylenically unsaturated bonds or less.

The polymerizable compound is preferably a compound represented by Formula (Z-6).

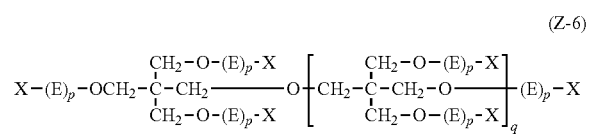

In Formula (Z-6), E's each independently represent —(CH$_2$)$_y$—CH$_2$—O—, —(CH$_2$)$_y$—CH(CH$_3$)—O—, —(CH$_2$)$_y$—CH$_2$—CO—O—, —(CH$_2$)$_y$—CH(CH$_3$)—CO—O—, —CO—(CH$_2$)$_y$—CH$_2$—O—, —CO—(CH$_2$)$_y$—CH(CH$_3$)—O—, —CO—(CH$_2$)$_y$—CH$_2$—CO—O—, or —CO—(CH$_2$)$_y$—CH(CH$_3$)—CO—O—. In these groups, the bonding position on the right side is preferably a bonding position on the X side.

y's each independently represent an integer of 1 to 10.

X's each independently represent a (meth)acryloyl group or a hydrogen atom.

p's each independently represent an integer of 0 to 10.

q represents an integer 0 to 3.

In Formula (Z-6), the total number of (meth)acryloyl groups is preferably (3+2q) or (4+2q).

p is preferably an integer of 0 to 6 and more preferably an integer of 0 to 4.

The total of each p is preferably 0 to (40+20q), more preferably 0 to (16+8q), and still more preferably 0 to (12+6q).

The compound represented by Formula (Z-6) may be used alone, or two or more kinds thereof may be used.

As the polymerizable compound, it is also possible to use, for example, the compounds described in paragraph 0050 of JP2008-260927A, paragraph 0040 of JP2015-068893A, paragraph 0227 of JP2013-029760A, and paragraphs 0254 to 0257 of JP2008-292970A.

The content of the polymerizable compound in the polymerizable composition is not particularly limited; however, it is preferably 1% to 35% by mass, more preferably 4% to 25% by mass, and still more preferably 8% to 20% by mass, with respect to the total solid content of the polymerizable composition.

One kind of polymerizable compound may be used alone, or two or more kinds thereof may be used. In a case where two or more polymerizable compounds are used, the total content thereof is preferably within the above range.

—Resin—

The polymerizable composition may contain the above-described resin.

The content of the resin in the polymerizable composition is not particularly limited; however, it is preferably 5% to 70% by mass, more preferably 10% to 60% by mass, and still more preferably 20% to 50% by mass, with respect to the total solid content of the polymerizable composition.

—Antioxidant—

The polymerizable composition may contain the above-described antioxidant.

The content of the antioxidant in the polymerizable composition is not particularly limited; however, it is preferably 0.001% to 10% by mass, more preferably 0.0025% to 5% by mass, and still more preferably 0.005% to 1% by mass, with respect to the total solid content of the polymerizable composition.

—Polymerization Initiator—

The polymerizable composition may contain a polymerization initiator.

Examples of the polymerization initiator include a photopolymerization initiator and a thermal polymerization initiator, where a photopolymerization initiator is preferable.

The photopolymerization initiator is not particularly limited as long as the photopolymerization initiator can initiate the polymerization of the polymerizable compound, and a known photopolymerization initiator can be used. The photopolymerization initiator is preferable, for example, a photopolymerization initiator having photosensitivity to light in the range from an ultraviolet region to a visible light region. The photopolymerization initiator may be a photoradical polymerization initiator, may be an initiator which generates active radicals by causing a certain action with a photoexcited sensitizing agent, or an initiator which initiates cationic polymerization according to the type of the polymerizable compound.

In addition, the photopolymerization initiator is preferably a compound having a molar absorption coefficient of at least 50 (l·mol$^{-1}$·cm$^{-1}$) within a range of 300 to 800 nm (more preferably 330 to 500 nm).

Examples of the photopolymerization initiator include a halogenated hydrocarbon derivative (for example, a compound having a triazine skeleton, a compound having an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, an aminoacetophenone compound, and hydroxyacetophenone.

The photopolymerization initiator is preferably an oxime-based photopolymerization initiator which is an oxime compound.

As the photopolymerization initiator, it is also possible to use the photopolymerization initiators described in paragraphs 0164 to 0186 of WO2019/069609A. Further, it is also possible to use the peroxycinnamate derivative described in JP2019-167313A.

The content of the photopolymerization initiator in the polymerizable composition is preferably 0.5% to 20% by mass, more preferably 1.0% to 10% by mass, and still more preferably 1.5% to 8% by mass, with respect to the total solid content of the polymerizable composition.

One kind of photopolymerization initiator may be used alone, or two or more kinds thereof may be used in combination. In a case where two or more photopolymerization initiators are used in combination, the total content thereof is preferably within the above range.

—Surfactant—

The polymerizable composition may contain a surfactant. The surfactant contributes to improvement in the coatability of the polymerizable composition.

Examples of the surfactant include a fluorine-based surfactant, a nonionic surfactant, a cationic surfactant, an anionic surfactant, and a silicone-based surfactant.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781F (all produced by DIC Corporation); FLUORAD FC430, FLUORAD FC431, and FLUORAD FC171 (all produced by Sumitomo 3M Limited); SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all produced by ASAHI GLASS CO., LTD.); and PF636, PF656, PF6320, PF6520, and PF7002 (produced by OMNOVA Solutions Inc.).

As the fluorine-based surfactant, a block polymer can also be used, and specific examples thereof include the compound described in JP2011-89090A.

In a case where the polymerizable composition contains a surfactant, the content of the surfactant is preferably 0.001% to 2.0% by mass, more preferably 0.003% to 0.5% by mass, and still more preferably 0.005% to 0.1% by mass, with respect to the total solid content of the polymerizable composition.

One kind of surfactant may be used alone, or two or more kinds thereof may be used in combination. In a case where two or more surfactants are used in combination, the total amount thereof is preferably within the above range.

—Solvent—

The composition may contain a solvent.

As the solvent, for example, known solvents can be used.

The content of the solvent in the polymerizable composition is preferably an amount such that the concentration of solid contents of the polymerizable composition is 10% to 90% by mass, more preferably an amount such that the solid content is 10% to 70% by mass, and still more preferably an amount such that the solid content is 20% to 60% by mass.

One kind of solvent may be used alone, or two or more kinds thereof may be used in combination. In a case where two or more solvents are used in combination, the content thereof is preferably adjusted so that the total solid content of the polymerizable composition is within the above range.

Examples of the solvent include water and an organic solvent.

Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, butyl acetate, methyl lactate, N-methyl-2-pyrrolidone, and ethyl lactate.

The polymerizable composition may further contain optional components other than the above-described components. Examples thereof include a dye, a particulate component (for example, a pigment or an infrared absorbing agent) other than the above-described components, an ultraviolet absorbing agent, a silane coupling agent, a sensitizer, a co-sensitizer, a crosslinking agent, a curing accelerator, a heat curing accelerator, a plasticizer, a diluent, and an oil sensitizing agent, and known additives such as an adhesion promoter to the surface of the substrate and other auxiliaries (for example, conductive particles, a filler, an anti-foaming agent, a flame retardant, a leveling agent, a peeling accelerator, a fragrance, a surface tension adjuster, a chain transfer agent, and the like) may be further contained, as necessary or may not be contained.

Regarding these components, reference can be made to, for example, the descriptions in paragraphs 0183 to 0228 of JP2012-003225A (corresponding to paragraphs 0237 to 0309 of US2013/0034812A), paragraphs 0101, 0102, 0103, 0104, and 0107 to 0109 of JP2008-250074A, and paragraphs 0159 to 0184 of JP2013-195480A, the contents of which are incorporated into the present specification.

The polymerizable composition is preferably prepared by producing a dispersion liquid in which particulate components such as metal nitride particles and/or metal oxynitride particles are dispersed, and further mixing the obtained dispersion liquid with other components.

The dispersion liquid is preferably prepared by mixing at least one selected from the group consisting of a metal nitride and a metal oxynitride, a resin, and a solvent. In addition, it is also preferable that a polymerization inhibitor is contained in the dispersion liquid.

The dispersion liquid can be prepared by mixing the above-described respective components by known mixing methods (for example, mixing methods using a stirrer, a homogenizer, a high-pressure emulsification device, a wet-type pulverizer, a wet-type disperser, or the like).

In a case of preparing the polymerizable composition, the respective components may be formulated at once, or each of the components may be dissolved or dispersed in a solvent and then sequentially formulated. Moreover, the input order and the operation conditions during the formulation are not particularly limited.

For the purpose of removing foreign substances, reducing defects, and the like, the polymerizable composition is preferably filtered with a filter. Any filter can be used without particular limitation as long as it is a filter, for example, which has been used in the related art for the use application to filtration or the like. Examples of the filter include filters made of a fluororesin such as polytetrafluoroethylene (PTFE), a polyamide-based resin such as nylon, a polyolefin-based resin (having a high density and an ultrahigh molecular weight) such as polyethylene and polypropylene (PP), or the like. Among these materials, polypropylene (including high-density polypropylene) or nylon is preferable.

The pore diameter of the filter is preferably 0.1 to 7.0 more preferably 0.2 to 2.5 still more preferably 0.2 to 1.5 and particularly preferably 0.3 to 0.7 In a case where the pore diameter is within the above range, it is possible to reliably remove fine foreign substances, such as impurities and aggregates, contained in a pigment while suppressing filtration clogging of the pigment (including a black pigment).

In a case of using a filter, different filters may be combined. In this case, filtering with a first filter may be carried out only once, or may be carried out twice or more times. In a case where filtering is carried out twice or more times with the combination of different filters, the pore diameters of the filters that are used in the second and subsequent filtering are preferably the same as or larger than the pore diameter of the filter that is used in the first filtering. In addition, the first filters having different pore diameters within the above range may be combined. Regarding the pore diameter mentioned here, reference can be made to nominal values of filter manufacturers. A commercial filter can be selected from various filters provided by, for example, Nihon Pall Ltd., Advantec Toyo Kaisha, Ltd., Nihon Entegris K. K. (formerly Nippon Microlith Co., Ltd.), Kitz Micro Filter Corporation.

As a second filter, a filter formed of the same material as that of the first filter, or the like can be used. The pore diameter of the second filter is preferably 0.2 to 10.0 more preferably 0.2 to 7.0 and still more preferably 0.3 to 6.0 µm.

The polymerizable composition preferably does not contain impurities. The content of impurities contained in these materials is preferably 1 ppm by mass or less, more preferably 1 ppb by mass or less, still more preferably 100 ppt by mass or less, and particularly preferably 10 ppt by mass or less, and it is most preferable that the impurities are substantially not contained (the content is equal to or less than the detection limit of the measuring device).

Furthermore, the impurities can be measured using an inductively coupled plasma mass spectrometer (manufactured by Agilent Technologies, Inc., Agilent 7500cs model).

In the composition layer forming step, prior to exposure, the polymerizable composition is applied on a photoelectric conversion film or the like to form a layer (composition layer) of the composition.

Examples of the method of applying the polymerizable composition onto a support include various coating methods such as a slit coating method, an ink jet method, a rotation coating method (a spin coating method), a cast coating method, a roll coating method, and a screen printing method can be applied.

The film thickness of the composition layer is preferably 0.1 to 10 more preferably 0.2 to 5 and still more preferably 0.2 to 3 The composition layer applied on a support such as a photoelectric conversion film can be dried (pre-baked) at a temperature of 50° C. to 140° C. for 10 to 300 seconds, for example, using a hot plate or an oven.

[Exposure Step]

In the exposure step, the composition layer (the dried film) formed in the composition layer forming step is exposed by irradiation with actinic rays or radiation, and the composition layer irradiated with light is cured.

In the method of light irradiation, it is preferable to carry out light irradiation through a photo mask having a patterned opening portion.

The exposure is preferably carried out by irradiation with radiation. The radiation, which can be used during the exposure, is preferably ultraviolet rays such as a g-line, an h-line, or an i-line, and a light source is preferably a high-pressure mercury lamp. The irradiation intensity is preferably 5 to 1,500 $mJ/cm^2$ and more preferably 10 to 1,000 $mJ/cm^2$.

In addition, in a case where the polymerizable composition contains a thermal polymerization initiator, the composition layer may be heated in the exposure step. The heating temperature is not particularly limited; however, it is preferably 80° C. to 250° C. In addition, the heating time is preferably 30 to 300 seconds.

It is noted that in a case where the composition layer is heated in the exposure step, the exposure step may serve as a post-heating step which will be described later.

[Development Step]

The development step is a step of developing the exposed composition layer to form an inorganic substance-containing film. By this step, the composition layer in a portion which is not irradiated with light in the exposure step is eluted, only a photo-cured portion remains, and thus a patterned inorganic substance-containing film can be obtained.

The kind of developer that is used in the development step is not particularly limited; however, it is desirably an alkali developer.

The development temperature is, for example, 20° C. to 30° C.

The development time is, for example, 20 to 90 seconds. The development is often carried out for 120 to 180 seconds in order to remove the residue better. Furthermore, in order to further improve residue removability, a step of shaking off the developer every 60 seconds and further supplying a fresh developer may be repeated several times.

The alkali developer is preferably an alkaline aqueous solution which is prepared by dissolving an alkaline compound in water so that the concentration thereof is 0.001% to 10% by mass (preferably 0.01% to 5% by mass).

Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among them, an organic base is preferable).

It is noted that in a case where the alkaline compound is used as an alkali developer, the alkaline compound is generally subjected to a washing treatment with water after development.

[Post-Baking]

A heating treatment (post-baking) is preferably carried out after the exposure step. The post-baking is a heating treatment after development for completing the curing. The heating temperature is preferably 240° C. or higher and more preferably 220° C. or higher. The lower limit thereof is not particularly limited; however, it is preferably 50° C. or more and more preferably 100° C. or more, in consideration of efficient and effective treatment.

The post-baking can be carried out continuously or batch-wise by using heating units such as a hot plate, a convection oven (hot-air circulating dryer), and a high frequency heater.

The post-baking is preferably carried out in an atmosphere of a low oxygen concentration. The oxygen concentration is preferably 19% by volume or less, more preferably 15% by volume or less, still more preferably 10% by volume or less, particularly preferably 7% by volume or less, and most preferably 3% by volume or less. The lower limit thereof is not particularly limited; however, it is practically equal to or higher than 10 ppm by volume.

In addition, the curing may be completed by ultraviolet (UV) irradiation instead of the post-baking with heating described above.

In this case, it is preferable that the polymerizable composition further contains a UV curing agent. The UV curing agent is preferably a UV curing agent which can be cured at a wavelength shorter than 365 nm which is an exposure wavelength of a polymerization initiator added for a lithography step by ordinary i-line exposure. Examples of the UV curing agent include Omnirad 2959 (corresponding to IRGACURE 2959 (former product name, formerly manufactured by BASF SE) manufactured IGM Resins B.V. In a case where UV irradiation is carried out, the composition layer is preferably a material which is cured at a wavelength of 340 nm or less. The lower limit value of the wavelength is not particularly limited; however, it is generally 220 nm or more. In addition, the exposure amount of the UV irradiation is preferably 100 to 5,000 mJ, more preferably 300 to 4,000 mJ, and still more preferably 800 to 3,500 mJ. The UV curing step is preferably carried out after the exposure step, in order to more effectively carry out low-temperature curing. As an exposure light source, an ozone-less mercury lamp is preferably used.

<Other Members>

The optical element may contain members other than the above-described photoelectric conversion film and inorganic substance-containing film.

As the other members, the optical element preferably contains, for example, two electrodes arranged to sandwich a photoelectric conversion film.

Examples of the electrode material include a metal, an alloy, a metal oxide, a metal nitride, a metal boride, an organic conductive compound, and a mixture thereof. Specific examples thereof include a conductive metal oxide such as tin oxide, zinc oxide, indium oxide, indium zinc oxide (IZO), indium tin oxide (ITO), or indium tungsten oxide (IWO); a metal such as gold, platinum, silver, chromium, nickel, or aluminum; a mixture or laminate of such a metal and a conductive metal oxide; an inorganic conductive material such as copper iodide or copper sulfide; an organic conductive material such as polyaniline, polythiophene, or polypyrrole; and a laminate thereof with ITO.

The electrode forming method can be appropriately selected depending on the material to be used. For example, in a case of indium tin oxide (ITO), the electrode can be formed by using an electron beam method, a sputtering method, a resistance heating vapor deposition method, a chemical reaction method (such as a sol-gel method), a method of applying a dispersion of indium tin oxide, or the like.

The photoelectric element may contain an insulating film.

The insulating film may be an inorganic film or an organic film. Examples of the inorganic film include an oxide film. Examples of the organic film include a resin film.

The photoelectric element may contain a support that supports a photoelectric conversion film and an inorganic substance-containing film.

<Manufacturing Method for Optical Element>

The manufacturing method for an optical element of the present invention is not particularly limited. However, from the viewpoint of productivity, it preferably includes a step of manufacturing a photoelectric conversion film that contains a quantum dot or at least one compound semiconductor selected from the group consisting of a III-V group compound semiconductor, a II-VI group compound semiconductor, and a IV-IV group compound semiconductor, and a step of manufacturing an inorganic substance-containing film containing at least one selected from the group consisting of a metal nitride and a metal oxynitride. It more preferably includes a step of manufacturing a photoelectric conversion film and a step of manufacturing an inorganic substance-containing film in this order.

The step of manufacturing the photoelectric conversion film is not particularly limited. However, as described above, it preferably includes a step of applying a composition for forming a photoelectric conversion film, containing a quantum dot and a solvent, by a spin coating method.

In addition, the step of manufacturing the inorganic substance-containing film preferably includes a step of applying a polymerizable composition containing at least one selected from the group consisting of a metal nitride and a metal oxynitride by a spin coating method.

Further, the step of manufacturing the inorganic substance-containing film preferably includes an exposure step and a development step.

Further, as described above, the polymerizable composition preferably contains a polymerizable compound and a polymerization initiator.

<Use Application>

The optical element according to the embodiment of the present invention can be applied to various applications.

The optical element can be applied to optical instruments such as a solid-state imaging element, an infrared sensor, a camera, binoculars, a microscope, and a semiconductor exposure device. Among the above, the optical element is preferably included in a solid-state imaging element and an infrared sensor.

EXAMPLES

Hereinbelow, the present invention will be described in more detail with reference to Examples. The materials, the amounts and proportions of the materials used, the details of treatments, the procedure of treatments, and the like shown in the following Examples can be appropriately modified as long as the gist of the present invention is maintained. Accordingly, the scope of the present invention will not be restrictively interpreted by the following Examples.

<Preparation of Dispersion Liquid>

(Preparation of Dispersion Liquid A-1)

A dispersing agent X-1 (5.5 parts by mass) described later was added to the titanium black (a-1) (20 parts by mass) produced according to the procedure described later, and cyclopentanone and propylene glycol monomethyl ether acetate (PGMEA) were added at a ratio (mass ratio) of 3/2 so that the concentration of solid contents was 35% by mass. The obtained dispersion was sufficiently stirred with a stirrer to carry out premixing. The obtained dispersion was subjected to a dispersion treatment using NPM Pilot manufactured by Shinmaru Enterprises Corporation under the following dispersion conditions to obtain a dispersion liquid A-1 (titanium black dispersion liquid A-1).

Dispersion Conditions
  Bead size: ϕ 0.05 mm
  Bead filling rate: 65% by volume
  Circumferential speed of mill: 12 m/sec
  Circumferential speed of separator: 13 m/s
  Amount of mixed solution subjected to dispersion treatment: 15.0 g
  Circulation flow rate (pump supply amount): 60 kg/hour
  Temperature of treatment liquid: 57° C.
  Inner volume of Beads mill annular passage: 2.2 L
  Number of passes: 84 passes
  Dispersing agent X-1 (the numerical value in each repeating unit represents the content (in terms of % by mass) with respect to all repeating units.)

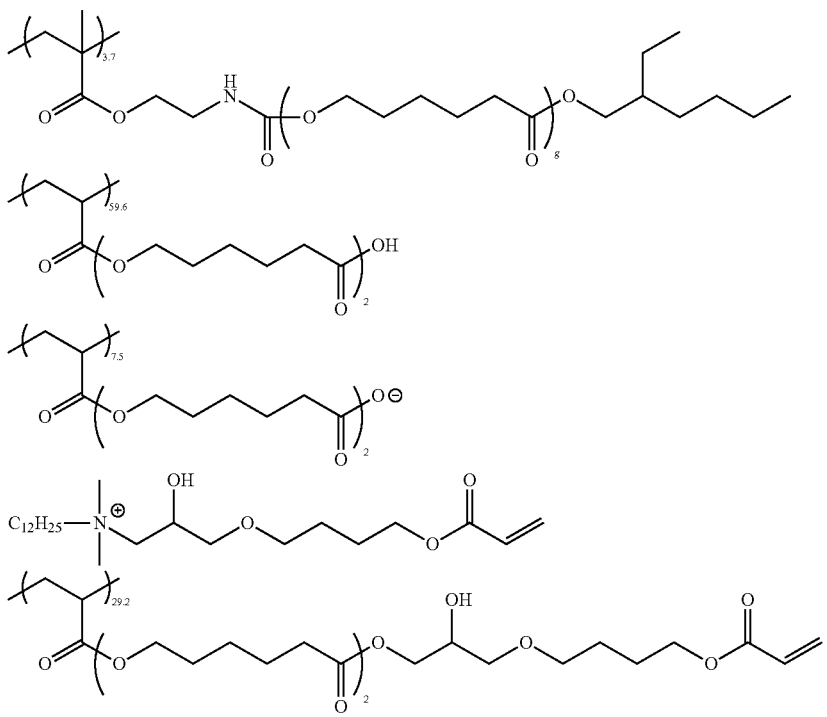

(Production of Titanium Black (a-1))

100 g of titanium oxide MT-150A (product name; manufactured by TAYCA CORPORATION) having an average primary particle diameter of 15 nm, 25 g of silica particles AEROPERL (registered product name) 300/30 (manufactured by Evonik Industries AG) having a BET surface area of 300 m²/g, and 100 g of dispersing agent Disperbyk190 (product name; manufactured by BYK Additives & Instruments) were weighed, and these were added to 71 g of ion exchange water to obtain a mixture.

Then, the mixture was treated for 20 minutes at a revolution speed of 1,360 rpm and a rotation speed of 1,047 rpm using MAZERUSTAR KK-400W manufactured by KURABO INDUSTRIES LTD. to obtain a mixed solution. A quartz vessel was filled with this mixed solution and heated to 920° C. in an oxygen atmosphere using a small-sized rotary kiln (manufactured by MOTOYAMA Co., Ltd.). Then, the atmosphere in the small-sized rotary kiln was replaced with nitrogen, and at the same temperature, an ammonia gas was allowed to flow into the small-sized rotary kiln at 100 mL/min for 5 hours to carry out the nitridization reduction treatment. After the completion of the treatment, the collected powder was pulverized in a mortar to obtain powdery titanium black (a-1) [a substance to be dispersed, containing titanium black (an oxynitride of titanium) particles and Si atoms, specific surface area: 73 m2/g)] containing Si atoms.

(Preparation of Dispersion Liquid A-2)

A dispersion liquid A-2 (a titanium black dispersion liquid A-2) was obtained in the same manner as the dispersion liquid A-1 except that the dispersing agent X-2 was used instead of the dispersing agent X-1.

Dispersing agent X-2 (the numerical value in each repeating unit represents the content (in terms of % by mass) with respect to all repeating units.)

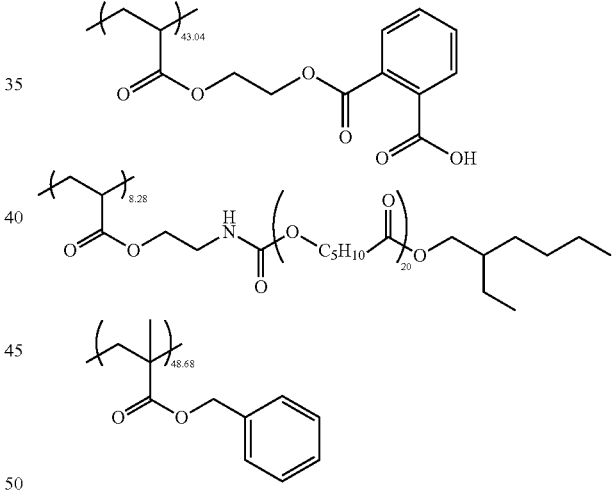

(Preparation of Dispersion Liquid A-3)

A dispersion liquid A-3 (a zirconium oxynitride dispersion liquid A-3) was obtained in the same manner as the dispersion liquid A-1 except that instead of the titanium black (a-1), the dispersing agent X-1, and cyclopentanone/propylene glycol monomethyl ether acetate, a zirconium oxynitride powder ZrO-1 produced according to the procedure described later was contained to a content of 25.00% by mass, the dispersing agent X-1 was contained to a content of 8.33% by mass, and a solvent (a mixed solvent of cyclopentanone/PGMEA=3/2 (in terms of mass ratio)) was contained to a content of 66.67% by mass with respect to the total mass.

(Manufacturing of ZrO-1 (Zirconium Oxynitride Powder))

A metal magnesium powder (7.3 g) having an average primary particle diameter of 150 μm and a magnesium nitride powder (9.0 g) having an average primary particle diameter of 200 nm were added to a monoclinic zirconium dioxide powder (7.4 g) having an average primary particle diameter of 50 nm, as calculated from a specific surface area measured according to the BET method, and the mixture was uniformly mixed by a reaction device in which a graphite boat was internally mounted in a quartz-made glass tube. Here, the adding amount of the metal magnesium was 5.0 molar times that of zirconium dioxide, and the adding amount of the magnesium nitride was 0.5 molar times that of zirconium dioxide. This mixture was calcined at a temperature of 700° C. for 60 minutes in an atmosphere of a nitrogen gas to obtain a calcined product. This calcined product was dispersed in 1 liter of water, 10% hydrochloric acid was gradually added thereto, the resultant was washed while keeping the pH at 1 or more and the temperature at 100° C. or lower, then the pH was adjusted to 7 to 8 with 25% aqueous ammonia, and filtration was carried out. The filtration solid content was redispersed in water at 400 g/liter, and the resultant was subjected again to the washing with acid and the pH adjustment with aqueous ammonia in the same manner as described above, and then filtered. After the washing with acid and the pH adjustment with aqueous ammonia were repeated twice as described above, the filtration product was dispersed in ion exchange water at 500 g/liter expressed in terms of solid contents, heating and stirring at 60° C. and pH adjustment to 7 were carried out, and then the resultant was filtered with a suction filtration device, further washed with an equal amount of ion exchange water, and dried by a hot air dryer at a set temperature of 120° C. to obtain a zirconium oxynitride powder ZrO-1.

(Preparation of Dispersion Liquid A-4)

A dispersion liquid A-4 (a zirconium nitride dispersion liquid A-4) was obtained in the same manner as the dispersion liquid A-3 except that instead of the zirconium oxynitride powder ZrO-1, the zirconia compound particle Zr-1 (manufactured by Nisshin Engineering Inc.) manufactured according to the thermal plasma method, which is described in Production Example 1 of WO2019/059359A, was used.

(Preparation of Comparative Dispersion Liquid AA-1 (Resin-Coated Carbon Black Dispersion Liquid AA-1))

A dispersed resin (10 parts by mass) was added to the resin-coated carbon black (30 parts by mass) obtained according to the procedure described later, and then PGMEA was added so that the concentration of solid contents was 35% by mass.

The obtained dispersion was sufficiently stirred with a stirrer to carry out premixing. The obtained dispersion was subjected to a dispersion treatment using ULTRA APEX MILL UAM015 manufactured by HIROSHIMA METAL & MACHINERY CO., LTD. under the following conditions to obtain a dispersion composition. After the completion of the dispersion, the beads and the dispersion liquid were separated with a filter to obtain a comparative dispersion liquid AA-1 (a resin-coated carbon black dispersion liquid AA-1) containing resin-coated carbon black.

(Production of Resin-Coated Carbon Black)

Carbon black was produced by an ordinary oil furnace method. Here, ethylene bottom oil having a small amount of Na, a small amount of Ca, and a small amount of S was used as stock oil, and combustion was carried out using a gas fuel. Moreover, pure water treated with an ion exchange resin was used as the reaction stopping water.

The obtained carbon black (540 g) was stirred together with pure water (14,500 g) using a homogenization mixer at 5,000 to 6,000 rpm for 30 minutes to obtain a slurry. The slurry was transferred to a container with a screw-type stirrer, and toluene (600 g) in which an epoxy resin "EPIKOTE 828" (produced by Japan Epoxy Resins Co., Ltd.) (60 g) was dissolved was added little by little into the container while carrying out mixing at about 1,000 rpm. In about 15 minutes, the total amount of the carbon black dispersed in water was transferred to the toluene side, thereby forming grains having a particle diameter of about 1 mm.

Next, draining was carried out with a wire mesh having 60 meshes, and then the separated grains were placed in a vacuum dryer and dried at 70° C. for 7 hours to remove toluene and water, thereby obtaining resin-coated carbon black. The resin-coating amount of the obtained resin-coated carbon black was 10% by mass with respect to the total amount of the carbon black and the resin.

Synthesis Example 1

(Preparation of Polymerizable Composition 1)

The following components were mixed with a stirrer to prepare a polymerizable composition 1.

| | |
|---|---|
| Dispersion liquid A-1 prepared as described above | 63 parts by mass |
| Alkali-soluble resin B-1 | 3.5 parts by mass |
| Polymerization initiator C-1 | 1.8 parts by mass |
| Polymerizable compound D-1 | 6.1 parts by mass |
| Antioxidant F-1 | 0.003 parts by mass |
| Surfactant G-1 | 0.02 parts by mass |
| Cyclopentanone/PGMEA = 50/50: | 25.5 parts by mass |

B-1: A compound having the following structures (the numerical value in each repeating unit represents the content (in terms of % by mass) with respect to all repeating units, and in the following structural formulae, the content is 10% by mass, 45% by mass, 10% by mass, 10% by mass, and 25% by mass in order from the left side.)

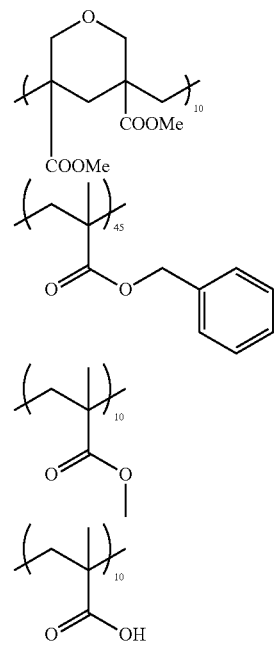

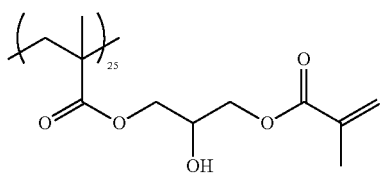

C-1: A compound having the following structure

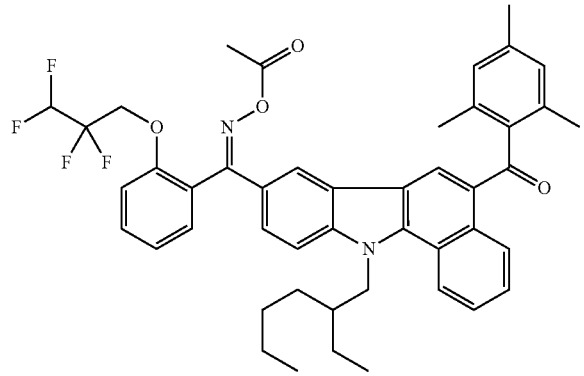 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

D-1: NK Ester A-TMMT (pentaerythritol tetraacrylate, manufactured by Shin-Nakamura Chemical Co., Ltd.)

Antioxidant

F-1: p-methoxyphenol

G-1: A compound having the following structure. Weight-average molecular weight=15,000. 62% and 38% in the following structural formula represent a molar ratio.

(A)

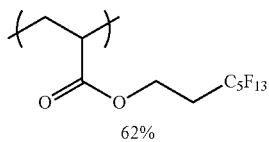

(B)

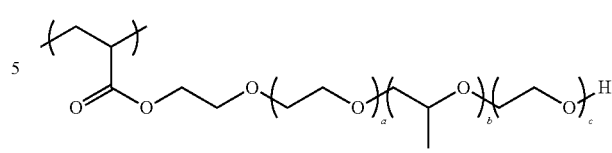

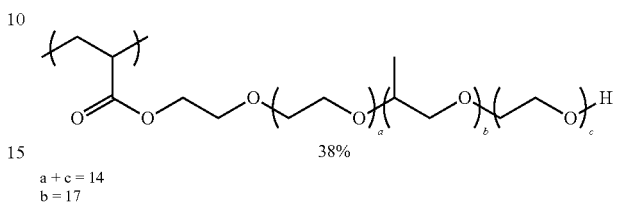

$a + c = 14$
$b = 17$

Synthesis Examples 2 to 14

Polymerizable compositions 2 to 9 and 11 to 14 were prepared according to the same procedure as in Synthesis Example 1 except that the kinds of compounds were changed as shown in Table 1.

It is noted that in a case where an additive (E-1, E-2, E-3) was used, the using amount of the additive used was 1 part by mass for E-1, 2.5 parts by mass for E-2, and 1 part by mass for E-3.

In addition, in the column of "Alkali-soluble resin", "B-2/B-3=25/75" means that 25% by mass of B-2 and 75% by mass of B-3 were used in the total mass of the alkali-soluble resin, "B-3/B-4=50/50" means that 50% by mass of B-3 and 50% by mass of B-4 were used in the total mass of the alkali-soluble resin, "D-2/D-3=50/50" in the column of "Polymerizable compound" means that 50% by mass of D-2 and 50% by mass of D-3 were used in the total mass of the polymerizable compound.

The polymerizable composition 10 was prepared by mixing the following components with a stirrer.

| | |
|---|---|
| Dispersion liquid A-1 | 94 parts by mass |
| Alkali-soluble resin B-1 | 0.9 parts by mass |
| Polymerization initiator C-1 | 1.0 parts by mass |
| Polymerizable compound D-1 | 3.0 parts by mass |
| Antioxidant F-1 | 0.003 parts by mass |
| Surfactant G-1 | 0.02 parts by mass |
| Cyclopentanone/PGMEA = 50/50 | 0.9 parts by mass |

TABLE 1

Composition of polymerizable composition

| Number | Dispersion liquid | Dispersant | Alkali-soluble resin | Polymerization initiator | Polymerizable compound | Additive | Antioxidant | Surfactant |
|---|---|---|---|---|---|---|---|---|
| 1 | A-1 | X-1 | B-1 | C-1 | D-1 | — | F-1 | G-1 |
| 2 | A-2 | X-2 | B-1 | C-2 | D-2 | — | F-1 | G-1 |
| 3 | A-1 | X-1 | B-2 | C-2 | D-2 | E-1 | F-1 | G-1 |
| 4 | A-1 | X-1 | B-2/B-3 = 25/75 | C-2 | D-3 | E-1 | F-1 | G-1 |
| 5 | A-2 | X-2 | B-3/B-4 = 50/50 | C-2 | D-2 | — | F-1 | G-1 |
| 6 | A-2 | X-2 | B-1 | C-1 | D-1 | E-2 | F-1 | G-1 |
| 7 | A-3 | X-1 | B-1 | C-1 | D-1 | — | F-1 | G-1 |
| 8 | A-1 | X-1 | B-1 | C-1 | D-1 | — | — | G-1 |
| 9 | A-4 | X-1 | B-1 | C-1 | D-1 | — | F-1 | G-1 |
| 10 | A-1 | X-1 | B-1 | C-1 | D-1 | — | F-1 | G-1 |
| 11 | A-1 | X-1 | B-2 | C-1 | D-2/D-3 = 50/50 | — | F-1 | G-1 |

TABLE 1-continued

| | Composition of polymerizable composition | | | | | | | |
|---|---|---|---|---|---|---|---|---|
| Number | Dispersion liquid | Dispersant | Alkali-soluble resin | Polymerization initiator | Polymerizable compound | Additive | Antioxidant | Surfactant |
| 12 | A-1 | X-1 | B-3 | C-2 | D-2 | — | F-1 | G-1 |
| 13 | A-1 | X-1 | B-1 | C-1 | D-1 | E-3 | F-1 | G-1 |
| 14 | AA-1 | X-1 | B-1 | C-1 | D-1 | — | — | G-1 |

It is noted that the respective components listed in Table 1 are as follows.

B-2: CYCLOMER P (ACA) 230AA (manufactured by Daicel Corporation)

B-3: A compound having the following structures (the numerical value in each repeating unit represents the content (in terms of % by mass) with respect to all repeating units, and in the following structural formulae, the content is 70% by mass and 30% by mass in order from the left side.)

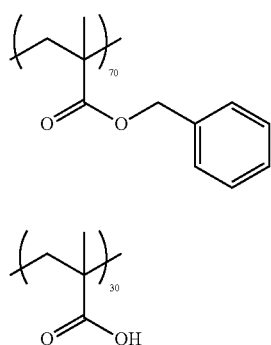

BzMA

MAA

B-4: A compound having the following structures (the numerical value in each repeating unit represents the content (in terms of % by mass) with respect to all repeating units, and in the following structural formulae, the content is 70% by mass, 10% by mass, and 20% by mass in order from the left side.)

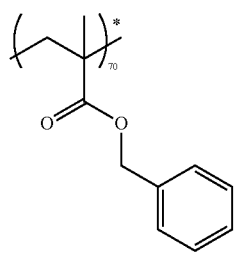

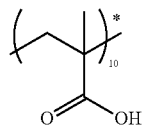

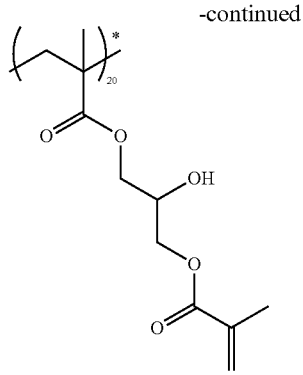

C-2: IRGACURE OXE02 (BASF Japan Ltd., an oxime-based photopolymerization initiator)

D-2: KAYARAD DPHA (manufactured by Nippon Kayaku Co., Ltd., a mixture of dipentaerythritol hexaacrylate and dipentaerythritol pentaacrylate)

D-3: KAYARAD RP-1040 (manufactured by Nippon Kayaku Co., Ltd., a tetrafunctional acrylate)

E-1: A compound having the following structure

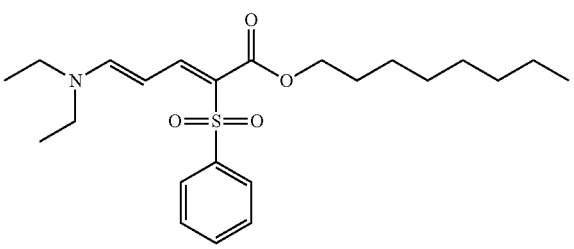 [SMILES: CCCCCCCCOC(=O)/C(=C/C=C/N(CC)CC)S(=O)(=O)c1ccccc1]

E-2: Silica dispersion liquid prepared according to the following method 9 g of KP-983 (produced by Shin-Etsu Chemical Co., Ltd., a silane coupling agent) was mixed with 100 g of IPA-ST-L (produced by Nissan Chemical Corporation, an isopropanol dispersion liquid of solid silica particles, concentration of solid contents: 30% by mass, average primary particle diameter: 45 nm) to obtain a mixed solution. To this mixed solution, 1.4 g of a 1% aqueous acetic acid solution and 1.4 g of distilled water were added, and stirring was carried out at 50° C. for 24 hours. Then, 1-methoxy-2-propanol was added to the mixed solution so that the solid content was 20% by mass, thereby obtaining a silica dispersion liquid E-2.

E-3: EHPE 3150 (manufactured by Daicel Corporation, an epoxy compound)

Example 1

Production of Quantum Dot Dispersion Liquid

Oleic acid (1.28 mL), lead oxide (2 mmol), and octadecene (38 mL) were weighed and taken in a flask and heated at 110° C. under the vacuum for 90 minutes to obtain a precursor solution. Then, the temperature of the precursor solution was adjusted to 95° C., the system was made to a nitrogen flow state, and subsequently, hexamethyldisilathiane (1 mmol) was injected together with octadecene (5 mL). Immediately after the injection, the flask was naturally cooled, and at the stage where the temperature reached 30° C., hexane (12 mL) was added thereto, and a solution was recovered. An excess amount of ethanol was added to the solution, centrifugation was carried out at 10,000 rpm for 10 minutes, and the precipitate was dispersed in octane, to obtain a dispersion liquid (concentration: 10 mg/mL) of PbS quantum dots, in which oleic acid was coordinated as a ligand on the surface of the PbS quantum dot.

The band gap of the PbS quantum dot in the obtained dispersion liquid of PbS quantum dot was estimated from light absorption measurement in the visible to infrared range by using an ultraviolet-visible-near-infrared spectrophotometer (V-670, manufactured by JASCO Corporation), and it was approximately 1.32 eV.

(Preparation of Photoelectric Conversion Film (L-1))

A titanium oxide film of 50 nm was formed by sputtering on a quartz glass substrate attached with a fluorine-doped tin oxide film. Next, the dispersion liquid of PbS quantum dots, obtained as described above, was added dropwise onto the titanium oxide film formed on the substrate, and spin coating was carried out at 2,500 rpm to form a PbS quantum dot aggregate film (a step 1). Next, a methanol solution (concentration: 0.1 mol/L) of 3-mercaptopropionic acid as the ligand solution was added dropwise onto the PbS quantum dot aggregate film, allowed to stand for 1 minute, and spin drying was carried out at 2,500 rpm. Next, methanol was added dropwise onto the PbS quantum dot aggregate film, and spin drying was carried out at 2,500 rpm for 20 seconds to carry out the ligand exchange of the ligand coordinated to the PbS quantum dot from oleic acid to 3-mercaptopropionic acid (a step 2). The operation of the step 1 and step 2 as one cycle was repeated until the thickness of the photoelectric conversion film was to be 100 nm, and a photoelectric conversion film (L-1), which is the PbS quantum dot aggregate film in which the ligand is exchanged from oleic acid to 3-mercaptopropionic acid, was formed to a thickness of 100 nm.

(Preparation of Metal Oxynitride-Containing Film)

The polymerizable composition 1 obtained as described above was applied onto the photoelectric conversion film (L-1) according to the spin coating method, and a coating film was formed so that the thickness of the inorganic substance-containing film to be finally obtained was 1.0 The substrate with a coating film was pre-baked at 100° C. for 120 seconds. Next, the substrate with a coating film was subjected to exposure in a proximity manner (exposure amount: 1,000 mJ/cm$^2$) with a high-pressure mercury lamp (lamp power: 50 mW/cm$^2$) through a mask with a line and space (L/S) pattern having an opening line width of by using UX-1000SM-EH04 (product name, manufactured by Ushio Inc.). Next, the puddle development was carried out with a developer "CD-2060" (product name, manufactured by FUJIFILM Electronic Materials Co., Ltd.) for 15 seconds using AD-1200 (manufactured by Mikasa Co., Ltd.) according to the puddle method. Next, an inorganic substance-containing film (thickness: 1.0 μm) was formed on the photoelectric conversion film (L-1) by carrying out washing with pure water for 30 seconds using a shower nozzle to remove the uncured portion, whereby an optical element was produced.

Examples 2 to 6, and 8 to 14

An optical element was produced according to the same procedure as in Example 1 except that instead of the polymerizable composition 1, each of the polymerizable compositions 2 to 14 was used as shown in Table 2.

Example 7

An optical element was produced according to the same procedure as in Example 1 except that the photoelectric conversion film (L-1) of Example 1 was changed to an InGaAs layer (L-2).

It is noted that the production of the InGaAs layer was carried out according to the metal organic chemical vapor deposition method (MOCVD).

Comparative Example 1

An optical element was produced according to the same procedure as in Example 7 except that the inorganic substance-containing film was not provided.

That is, the optical element of Comparative Example 1 does not include the inorganic substance-containing film.

<Evaluation>

(OD Evaluation at 1,550 nm)

The polymerizable compositions 1 to 14 were each applied on a glass substrate according to a spin coating method, and a coating film was formed so that the thickness of the inorganic substance-containing film to be finally obtained was 1.0 μm. The substrate with a coating film was pre-baked at 100° C. for 120 seconds. Next, the substrate with a coating film was subjected to the entire surface exposure in a proximity manner (exposure amount: 1,000 mJ/cm$^2$) with a high-pressure mercury lamp (lamp power: 50 mW/cm$^2$) by using UX-1000SM-EH04 (product name, manufactured by Ushio Inc.), and an inorganic substance-containing film (thickness: 1.0 μm) was formed on the glass substrate to prepare samples 1 to 14 for OD evaluation. It is noted that the number for the sample for OD evaluation corresponds to the number for the polymerizable composition. For example, a sample prepared by using the polymerizable composition 1 is a sample 1 for OD evaluation.

Next, using the samples 1 to 14 for OD evaluation, the light transmittance at 1,550 nm was measured with a device in which a spectrophotometer U-4100 (manufactured by Hitachi High-Tech Corporation) is combined with an integrating sphere type light receiving unit.

The OD value was calculated from the value of the light transmittance (%) at 1,550 nm according to the following expression.

$$OD=-\log_{10}(\text{light transmittance (\%) at 1,550 nm})$$

(Reliability)

Using a reliability test instrument (HASTEST MODEL 304R8, manufactured by HIRAYAMA Manufacturing Corporation), the optical elements obtained in Examples and Comparative Examples were subjected to a high-temperature and high-humidity test under the conditions of a temperature of 130° C. and a humidity of 85% for 250 hours. Then, the surface of the photoelectric conversion film portion was observed with an optical microscope, the number of cracks was counted and subjected to the conversion into the number thereof per 1 cm², and then the presence or absence of cracks was evaluated according to the following evaluation standards.

"A": The number of cracks per 1 cm² was 0.
"B": The number of cracks per 1 cm² was 1 to 10.
"C": The number of cracks per 1 cm² was 11 or more.

TABLE 2

| | Optical element | | | |
| --- | --- | --- | --- | --- |
| | Photoelectric conversion film | Polymerizable composition | Evaluation OD | Reliability |
| Example 1 | L-1 | 1 | 1.3 | A |
| Example 2 | L-1 | 2 | 1.3 | A |
| Example 3 | L-1 | 3 | 1.2 | A |
| Example 4 | L-1 | 4 | 1.2 | A |
| Example 5 | L-1 | 5 | 1.2 | A |
| Example 6 | L-1 | 6 | 1.4 | A |
| Example 7 | L-2 | 1 | 1.3 | A |
| Example 8 | L-1 | 7 | 1.1 | B |
| Example 9 | L-1 | 8 | 1.3 | B |
| Example 10 | L-1 | 9 | 1.0 | B |
| Example 11 | L-1 | 10 | 2.0 | A |
| Example 12 | L-1 | 11 | 1.3 | A |
| Example 13 | L-1 | 12 | 1.4 | A |
| Example 14 | L-1 | 13 | 1.3 | A |
| Comparative Example 1 | L-1 | 14 | 0.4 | C |

As shown in the table above, the optical element of the present invention exhibited a desired effect.

In addition, it was seen that from the comparison between Examples 1 to 7 and 9, a more excellent effect is obtained in a case where the antioxidant was used.

Further, the same effect can be obtained even in a case where the polymerization initiator C-1 and the polymerization initiator C-2 are used in combination.

Furthermore, the same effect can be obtained even in a case where the surfactant G-1 is not added.

Furthermore, the same effect can be obtained even in a case where the optical element contains a film other than the inorganic substance-containing film.

What is claimed is:

1. An optical element comprising:
   a photoelectric conversion film; and
   an inorganic substance-containing film containing at least one selected from the group consisting of a metal nitride and a metal oxynitride,
   wherein the photoelectric conversion film contains a quantum dot or at least one compound semiconductor selected from the group consisting of a III-V group compound semiconductor, a II-VI group compound semiconductor, and a IV-IV group compound semiconductor, and
   an optical density of the inorganic substance-containing film is 0.5 or more per 1.0 μm of a film thickness at a wavelength of 1,550 nm.

2. The optical element according to claim 1,
   wherein the metal nitride and the metal oxynitride contain Ti or Zr.
3. The optical element according to claim 1,
   wherein the inorganic substance-containing film further contains at least one selected from the group consisting of a phenol compound, a phosphorous acid ester compound, a thioether compound, and a hindered amine compound.
4. The optical element according to claim 1,
   wherein the optical density is 1.0 or more.
5. The optical element according to claim 1,
   wherein the inorganic substance-containing film further contains a resin.
6. The optical element according to claim 5,
   wherein the resin is an alkali-soluble resin.
7. The optical element according to claim 1,
   wherein a ratio of the film thickness of the inorganic substance-containing film to a film thickness of the photoelectric conversion film is 0.3 to 300.
8. An infrared sensor comprising the optical element according to claim 1.
9. A solid-state imaging element comprising the optical element according to claim 1.
10. A manufacturing method for an optical element according to claim 1, the manufacturing method comprising:
    a step of manufacturing a photoelectric conversion film that contains a quantum dot or at least one compound semiconductor selected from the group consisting of a III-V group compound semiconductor, a II-VI group compound semiconductor, and a IV-IV group compound semiconductor; and
    a step of manufacturing an inorganic substance-containing film containing at least one selected from the group consisting of a metal nitride and a metal oxynitride.
11. The manufacturing method for an optical element according to claim 10,
    wherein the step of manufacturing the photoelectric conversion film includes a step of applying the composition for forming a photoelectric conversion film, containing a quantum dot and a solvent, by a spin coating method.
12. The manufacturing method for an optical element according to claim 10,
    wherein the step of manufacturing the inorganic substance-containing film includes a step of applying a polymerizable composition containing at least one selected from the group consisting of a metal nitride and a metal oxynitride by a spin coating method.
13. The manufacturing method for an optical element according to claim 12,
    wherein the polymerizable composition further contains a polymerizable compound and a polymerization initiator.
14. The manufacturing method for an optical element according to claim 10,
    wherein the step of manufacturing the inorganic substance-containing film includes an exposure step and a development step.

* * * * *